(12) United States Patent
Kim et al.

(10) Patent No.: US 8,288,768 B2
(45) Date of Patent: Oct. 16, 2012

(54) THIN FILM TRANSISTOR, METHOD OF MANUFACTURING THE SAME, AND FLAT PANEL DISPLAY DEVICE HAVING THE SAME

(75) Inventors: Min-Kyu Kim, Yongin (KR); Jin-Seong Park, Yongin (KR); Tae-Kyung Ahn, Yongin (KR); Hyun-Joong Chung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 277 days.

(21) Appl. No.: 12/690,149

(22) Filed: Jan. 20, 2010

(65) Prior Publication Data

US 2010/0181563 A1     Jul. 22, 2010

(30) Foreign Application Priority Data

Jan. 20, 2009   (KR) .................. 10-2009-0004549

(51) Int. Cl.
*H01L 29/12*     (2006.01)
*H01L 21/34*     (2006.01)

(52) U.S. Cl. ........... 257/43; 257/E29.094; 257/E51.006; 257/E21.46; 438/104

(58) Field of Classification Search .............. 257/43, 257/E29.094, E51.006
See application file for complete search history.

(56) References Cited

U.S. PATENT DOCUMENTS

| 2001/0030322 | A1* | 10/2001 | Yamazaki et al. | 257/59 |
| 2007/0007870 | A1* | 1/2007 | Yamazaki et al. | 313/112 |
| 2008/0049159 | A1* | 2/2008 | Tsaur et al. | 349/47 |
| 2008/0315194 | A1* | 12/2008 | Kim et al. | 257/43 |

FOREIGN PATENT DOCUMENTS

| JP | 2000-150900 | 5/2000 |
| JP | 2004-273614 | 9/2004 |
| JP | 2006-332497 | 12/2006 |
| JP | 2007-123861 | 5/2007 |
| JP | 2007-220817 | 8/2007 |
| KR | 10-2006-0023460 | 3/2006 |
| KR | 10-2007-0068777 | 7/2007 |
| KR | 10-2007-0083129 | 8/2007 |

OTHER PUBLICATIONS

Korean Office Action issued on Oct. 25, 2010 in the corresponding Korean Patent Application No. 10-2009-0004549 and Request for Entry of the Accompanying Document herewith.

* cited by examiner

*Primary Examiner* — Wensing Kuo
(74) *Attorney, Agent, or Firm* — Robert E. Bushnell, Esq.

(57) ABSTRACT

A thin film transistor using an oxide semiconductor as an active layer, and its method of manufacture. The thin film transistor includes: a substrate; an active layer formed of an oxide semiconductor; a gate insulating layer formed of a dielectric on the active layer, the dielectric having an etching selectivity of 20 to 100:1 with respect to the oxide semiconductor; a gate electrode formed on the gate insulating layer; an insulating layer formed on the substrate including the gate electrode and having contact holes to expose the active layer; and source and drain electrodes connected to the active layer through the contact holes. Since the source and drain electrodes are not overlapped with the gate electrode, parasitic capacitance between the source and drain electrodes and the gate electrode is minimized. Since the gate insulating layer is formed of dielectric having a high etching selectivity with respect to oxide semiconductor, the active layer is not deteriorated.

26 Claims, 5 Drawing Sheets

THIN FILM TRANSISTOR, METHOD OF MANUFACTURING THE SAME, AND FLAT PANEL DISPLAY DEVICE HAVING THE SAME

CLAIM OF PRIORITY

This application makes reference to, incorporates the same herein, and claims all benefits accruing under 35 U.S.C. §119 from an application earlier filed in the Korean Intellectual Property Office on the 20 Jan. 2009 and there duly assigned Serial No. 10-2009-0004549.

BACKGROUND OF THE INVENTION

1. Field of the Invention

The present invention relates to a thin film transistor, a manufacturing method thereof, and a flat panel display device having the same. More particularly, the present invention relates to a thin film transistor using an oxide semiconductor as an active layer, a manufacturing method thereof, and a flat panel display device having the same.

2. Description of the Related Art

Flat panel display devices such as a liquid crystal display device (LCD) and an organic light emitting display device (OLED) are classified into a passive matrix type and an active matrix type according to a driving method of pixels.

Since respective pixels are controlled by thin film transistors (TFT) serving as a switch, the active matrix type flat panel display device has a short response time and a high image quality.

In the thin film transistor used in the active matrix type flat panel display device, an active layer for providing source and drain regions and a channel region is made of semiconductor such as amorphous silicon, poly-silicon, and low temperature poly-silicon (LTPS).

However, when the active layer is formed of amorphous silicon, it is difficult to realize a drive circuit operated at a high speed due to its low mobility. When the active layer is formed of poly-silicon, since its threshold voltage is not uniform due to its polycrystalline nature. An active layer formed of low-temperature poly-silicon requires the laser heat treatment for crystallization.

In order to solve the above problems, studies on use of an oxide semiconductor layer as an active layer are recently being carried out.

Japanese Patent Laid-Open No. 2004-273614 discloses a thin film transistor in which an oxide semiconductor mainly consists of zinc oxide (ZnO) as an active layer.

The oxide semiconductor mainly consisting of zinc oxide (ZnO) is judged to be amorphous and stable. When such an oxide semiconductor is used as an active layer, a thin film transistor can be manufactured at a low temperature using conventional equipment without purchasing separate equipment and processes such as ion implantation can be omitted.

However, since the oxide semiconductor has a low etching selectivity with respect to silicon oxide (SiOx) or silicon nitride (SiNx) used as a gate insulating layer, the active layer may be deteriorated during the patterning of the gate insulating layer. Like the thin film transistor of Japanese Patent Laid-Open No. 2004-273614, in a structure in which source and drain electrode are overlapped with a gate electrode, a signal delay or cross talk may be occurred due to parasitic capacitance between the source and drain electrodes and the gate electrode.

The above information disclosed in this Related Art section is only for enhancement of understanding of the background of the invention and therefore it may contain information that does not form the prior art that is already known to a person of ordinary skill in the art.

SUMMARY OF THE INVENTION

Accordingly, it is an aspect of the present invention to provide a thin film transistor capable of preventing deterioration of an active layer that occurs during the patterning of a gate insulating layer, a method of manufacturing the same, and a flat panel display device having the same.

It is another aspect of the present invention to provide a thin film transistor capable of miniaturizing parasitic capacitance between source and drain electrodes and a gate electrode, a method of manufacturing the same, and a flat panel display device having the same.

In order to achieve the foregoing and/or other objects of the present invention, according to an aspect of the present invention, there is provided a thin film transistor comprising: a substrate; an active layer of an oxide semiconductor formed on the substrate; a gate insulating layer formed of a dielectric on the active layer, the dielectric having an etching selectivity of 20 to 100:1 with respect to the oxide semiconductor; a gate electrode formed on the gate insulating layer; an insulating layer formed on the substrate including the gate electrode and having contact holes to expose the active layer at both sides of the gate electrode; and source and drain electrodes connected to the active layer through the contact holes.

According to another aspect of the present invention, there is provided a method of manufacturing a thin film transistor including: sequentially forming a semiconductor layer, a dielectric layer, and a conductive layer on a substrate; forming a gate electrode by patterning the conductive layer; forming a gate insulating layer by patterning the dielectric layer using the gate electrode as a mask; forming the active layer by patterning the oxide semiconductor layer; forming an insulating layer on the substrate including the gate electrode and forming contact holes to expose the active layer at both sides of the gate electrode; and forming source and drain electrodes connected to the active layer through the contact hole in the insulating layer.

According to still another aspect of the present invention, there is provided a flat panel display including: a first substrate in which a plurality of pixels are defined by a plurality of first conductive lines and second conductive lines, a thin film transistor controlling signals to be supplied to the respective pixels, and a first electrode connected to the thin film transistor is formed; a second substrate in which a second electrode is formed; and a liquid crystal layer injected into a sealed space between the first electrode and the second electrode; wherein the thin film transistor includes: an active layer formed of an oxide semiconductor on the first substrate; a gate insulating layer formed of a dielectric on the active layer, the dielectric having an etching selectivity of 20 to 100:1 with respect to the oxide semiconductor; a gate electrode foamed on the gate insulating layer; an insulating layer formed on the substrate including the gate electrode and having contact holes to expose the active layer at both sides of the gate electrode; and source and drain electrodes connected to the active layer through the contact holes.

According to still another aspect of the present invention, there is provided a flat panel display device including: an organic light emitting diode including a first substrate in which a first electrode, an organic thin film, and a second electrode and a thin film transistor controlling the organic light emitting diode are formed; and a second substrate disposed to face the first substrate; wherein the thin film transistor includes: an active layer formed of an oxide semiconductor on the first substrate; a gate insulating layer formed of a dielectric on the active layer, the dielectric having an etching selectivity of 20 to 100:1 with respect to the oxide semiconductor; a gate electrode formed on the gate insulating layer; an insulating layer formed on the substrate including the gate electrode and having contact holes to expose the active layer at both sides of the gate electrode; and source and drain electrodes connected to the active layer through the contact holes.

According to the thin film transistor of the present invention, since the active layer is formed of oxide semiconductor, the thin film transistor can be manufactured at a low temperature using conventional equipment without purchasing separate equipment and processes such as ion implantation can be omitted. Moreover, since the source and drain electrodes are not overlapped with the gate electrode, parasitic capacitance between the source and drain electrodes and the gate electrode is miniaturized so that signal delay and cross talk are not generated.

Furthermore, according to the method of manufacturing a thin film transistor of the present invention, since the gate insulating layer is patterned using the gate electrode as a mask, fewer masks, less time, and fewer processes are involved in the method. Since the gate insulating layer is formed of a dielectric with a high etching selectivity with respect to oxide semiconductor, deterioration of the active layer does not occur during the patterning of the gate insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
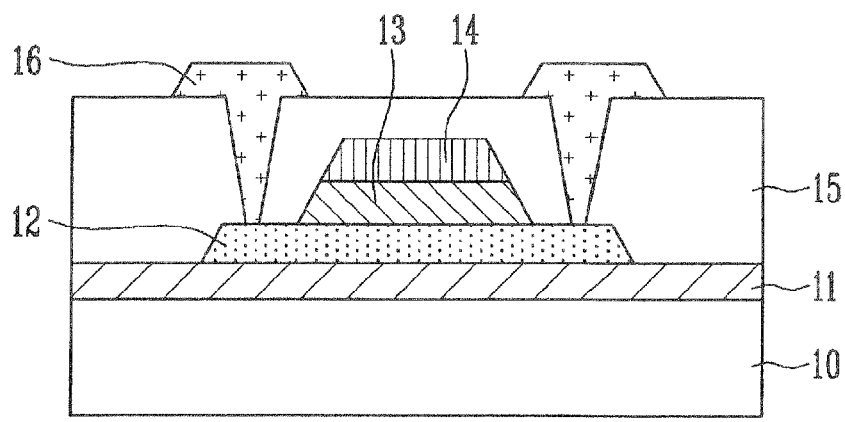
FIG. 1 is a cross-sectional view illustrating a thin film transistor according to the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

Hereinafter, certain exemplary embodiments according to the present invention will be described with reference to the accompanying drawings.

FIG. 1 is a cross-sectional view illustrating a thin film transistor according to the present invention.

Referring to FIG. 1, buffer layer 11 is formed on substrate 10, and active layer 12 made of an oxide semiconductor is formed on buffer layer 11. Active layer 12 providing source and drain regions and a channel region is made of zinc oxide (ZnO), ZnGaO, ZnInO, ZnSnO, or GaInZnO on which at least one ion of gallium (Ga), indium (In), stannum (Sn), zirconium (Zr), hafnium (Hf), and vanadium (V) is doped to zinc oxide (ZnO).

Gate insulating layer 13 and gate electrode 14 are formed on active layer 12. Gate insulating layer 13 and gate electrode 14 are formed on the channel region of oxide semiconductor layer 12. Gate insulating layer 13 is formed of a dielectric having an etching selectivity with respect to the oxide semiconductor forming active layer 12 higher than 20:1, preferably 20 to 100:1. Aluminum oxide ($Al_xO_y$), hafnium oxide ($Hf_xO_y$), yttrium oxide ($Y_xO_y$), zirconium oxide ($Zr_xO_y$), and Gallium oxide ($GaO_x$), or a mixture thereof can be used as the dielectric having a high dielectric constant (high-k) of 3 to 30. In the dielectrics, x and y are preferably in a range of 1 to 3.

Insulating layer 15 is formed on the substrate including gate electrode 14, and contact holes are formed in insulating layer 15 to expose the source and drain regions of active layer 12. Source and drain electrodes 16 are formed on insulating layer 15 to be connected to the source and drain regions of active layer 12 through the contact holes. In this case, source and drain electrodes 16 are formed without overlapping with gate electrode 14.

As described above, the thin film transistor according to the present invention, since the active layer is formed of an oxide semiconductor, a thin film transistor can be manufactured at a low temperature using conventional equipment without purchasing separate equipment and processes such as ion implantation can be omitted. Moreover, since source and drain electrodes 16 are not overlapped with gate electrode 14, a parasitic capacitance between source and drain electrodes 16 and gate electrode 14 is miniaturized so that a signal delay or cross talk does not occur.

Hereinafter, the present invention will be described in detail through a process of manufacturing the thin film transistor.

FIGS. 2A to 2D are cross-sectional views illustrating a method of manufacturing a thin film transistor according to the present invention.

Figure 2A:
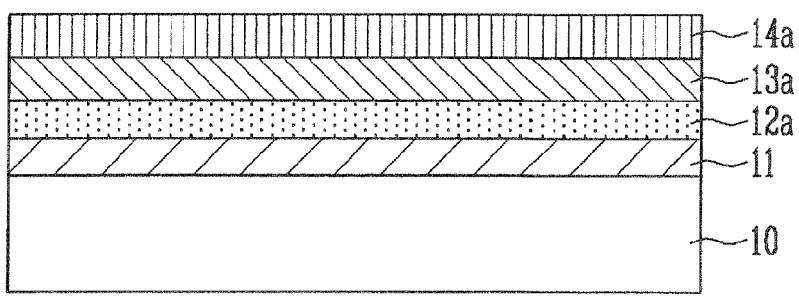
FIGS. 2A to 2D are cross-sectional views illustrating a method of manufacturing a thin film transistor according to the present invention.

Referring to FIG. 2A, after forming buffer layer 11 the substrate 10, oxide semiconductor layer 12a, dielectric layer 13a, and conductive layer 14a are sequentially formed on buffer layer 11.

Oxide semiconductor layer 12a is formed of zinc oxide (ZnO) or ZnGaO, ZnInO, ZnSnO, and GaInZnO that are zinc oxide (ZnO) doped with at least one ion of gallium (Ga), indium (In), stannum (Sn), zirconium (Zr), hafnium (Hf), and vanadium (V). Moreover, the dielectric layer 13a is formed of a dielectric having an etching selectivity with respect to the oxide semiconductor forming active layer 12a higher than 20:1, preferably 20 to 100:1. Aluminum oxide (AlxOy), hafnium oxide (HfxOy), yttrium oxide (YxOy), zirconium oxide (ZrxOy), and Gallium oxide (GaOx), or a mixture thereof can be used as the dielectric having a high dielectric constant (high-k) of 3 to 30.

Figure 2B:
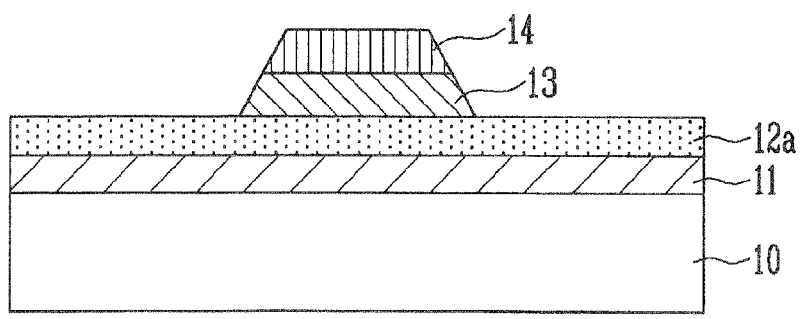

Referring to FIG. 2B, the gate electrode 14 is formed by patterning conductive layer 14a, and then the gate insulating layer 13 is formed by patterning dielectric layer 13a via etching using gate electrode 14 as a mask. The etching process for patterning dielectric layer 13a is performed by a dry etching process, in which oxide semiconductor layer 12a is not deteriorated due to a high etching selectivity even when oxide semiconductor layer 12a is exposed during the patterning of dielectric layer 13a.

If dielectric layer 13a is formed of silicon oxide (SiOx) or silicon nitride (SiNx) having a dielectric constant of 2 to 3, since the silicon oxide (SiOx) and the silicon nitride (SiNx) have an etching selectivity of 10:1 with respect to the oxide semiconductor, active layer 12 may be deteriorated. However, since dielectric layer 13a is formed of material having an etching selectivity of 20 to 100:1 with respect to the oxide semiconductor, it is possible to prevent oxide semiconductor layer 12a exposed during the patterning of dielectric layer 13a from being deteriorated. Moreover, since gate insulating layer 13 is formed of a dielectric having a high dielectric constant, when a capacitor of metal/insulator/semiconductor structure having gate electrode 14 and active layer 12 as electrodes, for example, when a capacitor connected to a transistor is implemented, high capacitance can be easily achieved.

Figure 2C:
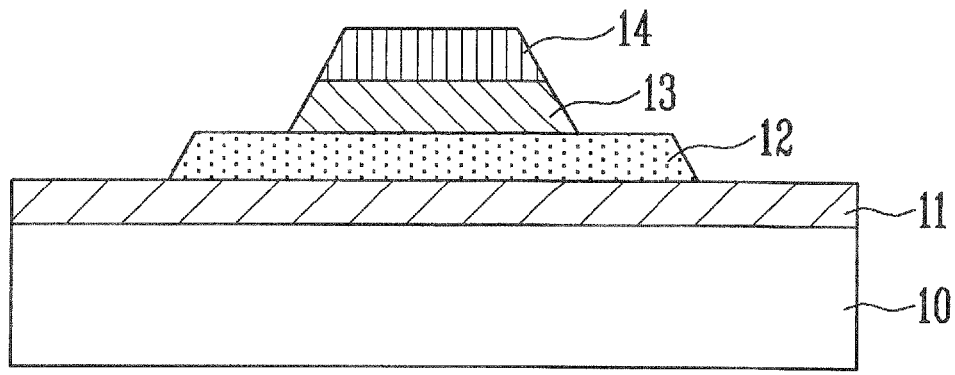

Referring to FIG. 2C, active layer 12 is formed by patterning the oxide semiconductor layer 12a. Active layer 12 is formed such that the channel region thereof overlaps with gate electrode 12. Active layer 12 is formed to have a width greater than gate electrode 14 such that both sides of gate electrode 14, i.e., the source and drain regions of active layer 12, can be exposed.

Figure 2D:
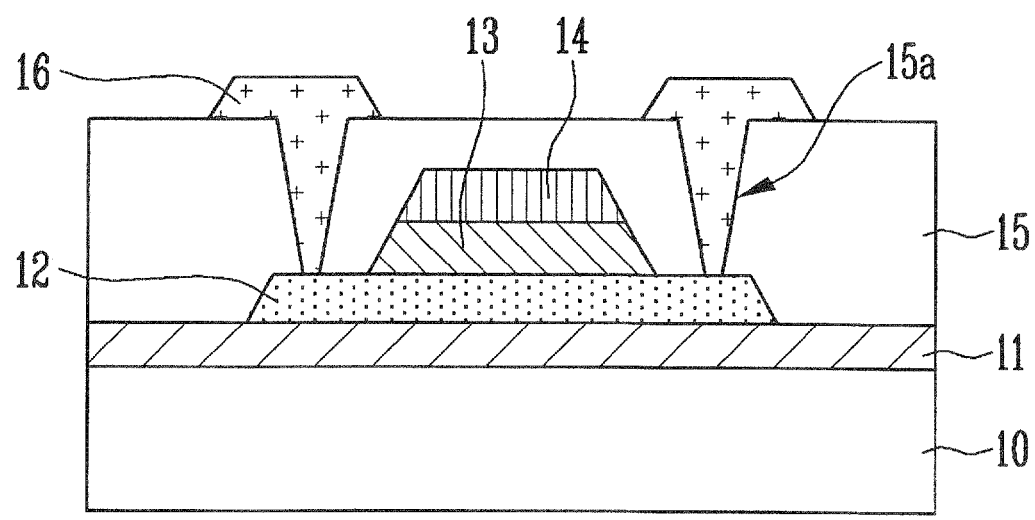

Referring to FIG. 2D, after forming insulating layer 15 on the substrate including gate electrode 14 with silicon oxide (SiOx), silicon nitride (SiNx), and silicon oxynitride (SiONx), contact holes 15a are formed to expose the active layer at both sides of gate electrode 14. Source and drain electrodes 16 are formed on insulating layer 15 to be connected to active layer 12 through contact holes 15a. In this case, source and drain electrodes 16 do not overlapped with gate electrode 14.

The thin film transistor of the present invention formed as described above can be applied to a flat panel display device.

Figure 3:
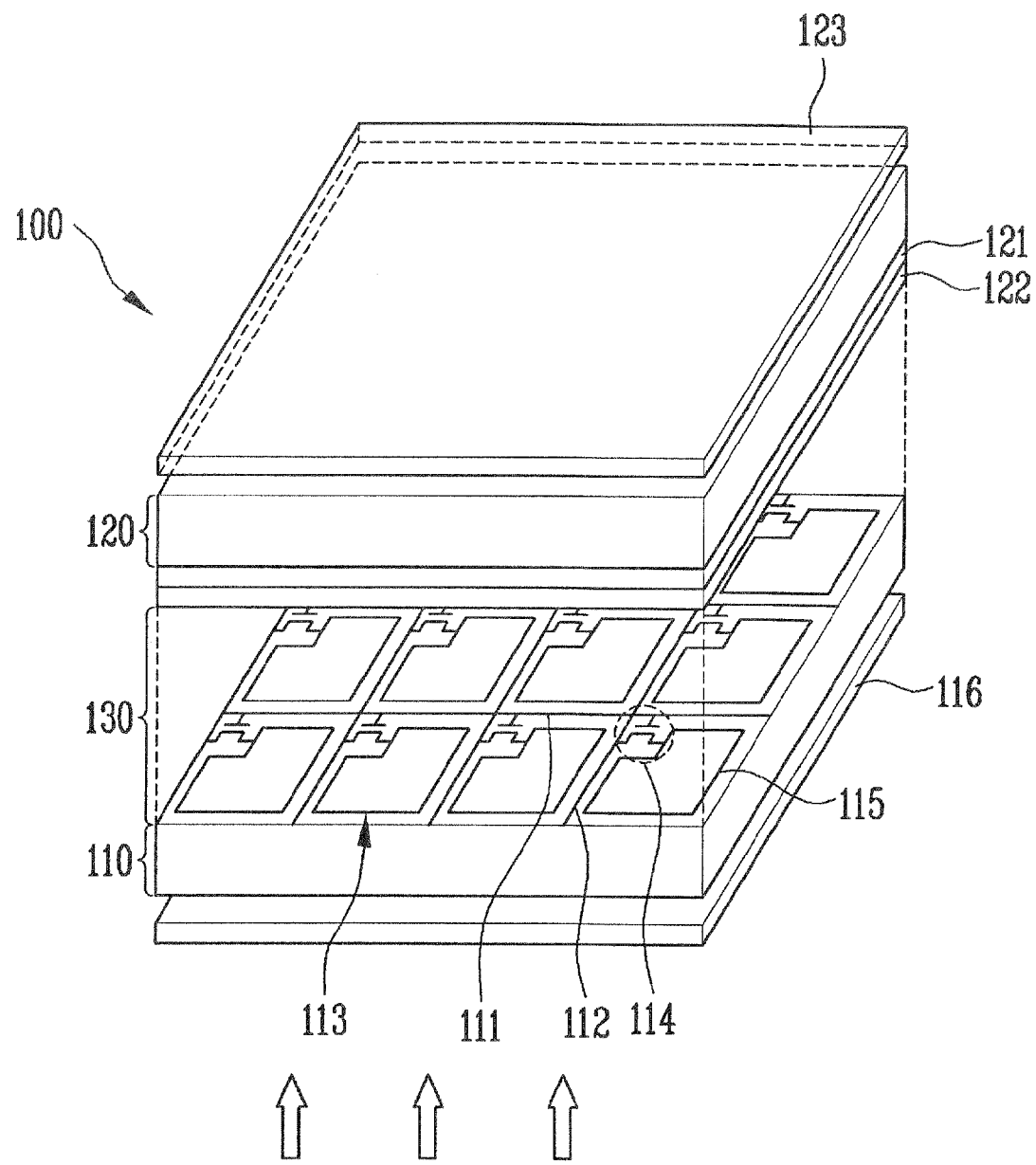
FIG. 3 is a plan view illustrating an embodiment of a flat panel display device employing the thin film transistor according to the present invention.

FIG. 3 is a perspective view illustrating an embodiment of a flat panel display device employing the thin film transistor according to the present invention, and the flap panel display device will be described by concentrating display panel 100 for displaying an image.

Display panel 100 includes two substrates 110 and 120 which are disposed to face each other and liquid crystal layer 130 disposed between the two substrates 110 and 120, in which to pixel region 113 is defined by a plurality of gate lines 111 and data lines 112 which are arranged in a matrix manner. Thin film transistor 114 controlling signals to be supplied to pixels and pixel electrode 115 connected to thin film transistor 114 are formed on intersection portions of substrate 110 of gate lines 111 and the data lines 112.

Thin film transistor 114 has a structure as shown in FIG. 1 and can be manufactured by the manufacturing method as described with reference to FIGS. 2A to 2D.

Color filter 121 and common electrode 122 are formed on substrate 120. Polarizing plates 116 and 123 are formed behind substrates 110 and 120, respectively, and a backlight (not shown) is disposed behind polarizing plate 116 as a light source.

Meanwhile, an LCD drive IC (not shown) for driving display panel 110 is mounted around pixel region 113 of display panel 100. The LCD drive IC converts an electric signal provided from the outside into a scan signal and a data signal and supplies the converted signals to gate lines 111 and data lines 112, respectively.

Figure 4A:
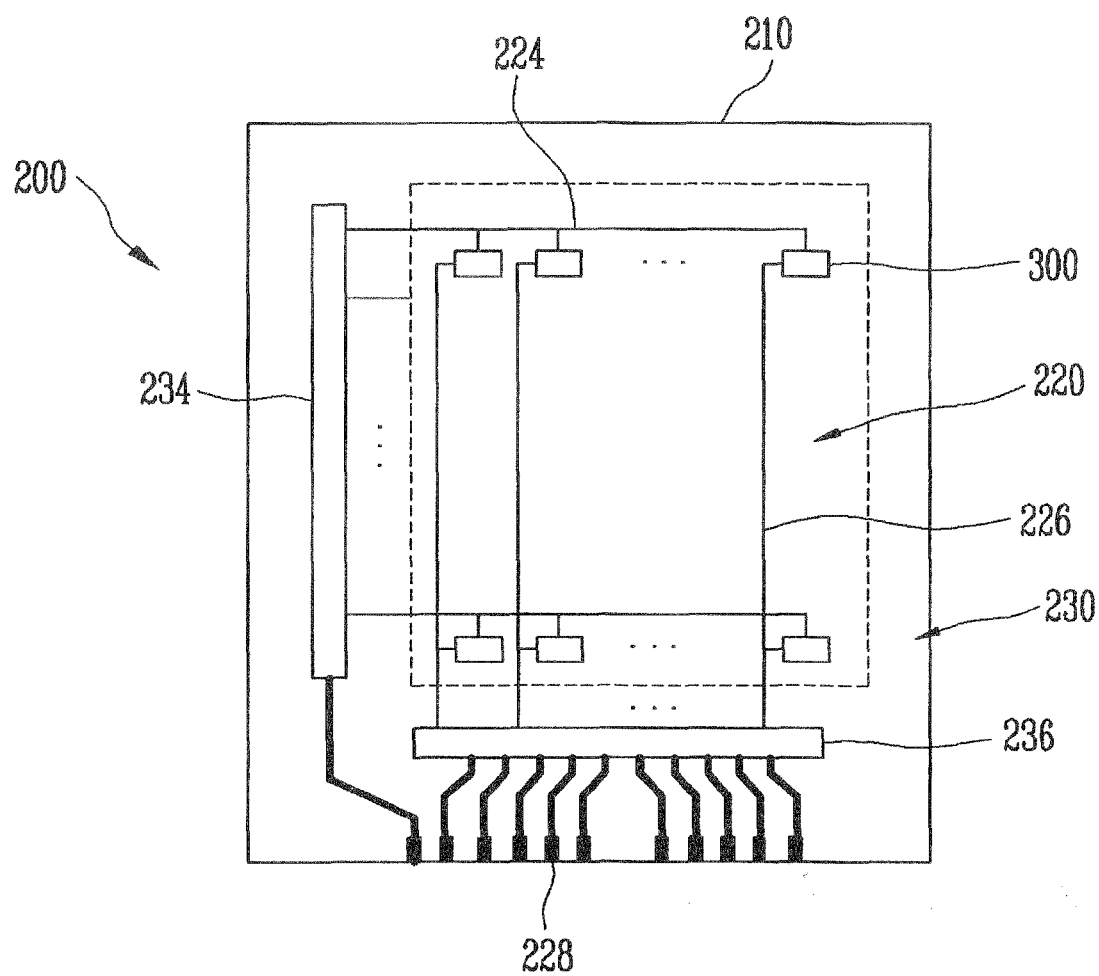
FIGS. 4A and 4B are a plan view and a cross-sectional view illustrating another embodiment of a flat panel display device employing the thin film transistor according to the present invention.
Figure 4B:
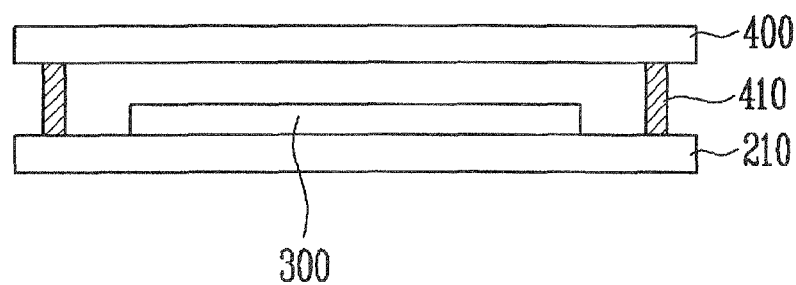

FIGS. 4A and 4B are a plan view and a cross-sectional view illustrating another embodiment of a flat panel display device employing the thin film transistor according to the present invention, and the flat panel display device will be briefly described by concentrating display panel 200 for displaying an image.

Referring to FIG. 4A, substrate 210 is defined by pixel region 220 and non-pixel region 230 around pixel region 220. A plurality of organic light emitting display devices 300 connected to scan lines 224 and data lines 226 in a matrix manner are formed in pixel region 220 of substrate 210. In non-pixel region 230 of substrate 210, scan lines 224 and data lines 226 extending from scan lines 224 and data lines 226 of pixel region 220, a power supplying line (not shown) for driving organic light emitting display device 300, and scan driving unit 234 and data driving unit 236 for processing signals provided from the outside through pad 228 to supply the processed signals to scan lines 224 and data lines 226 are formed.

Figure 5:
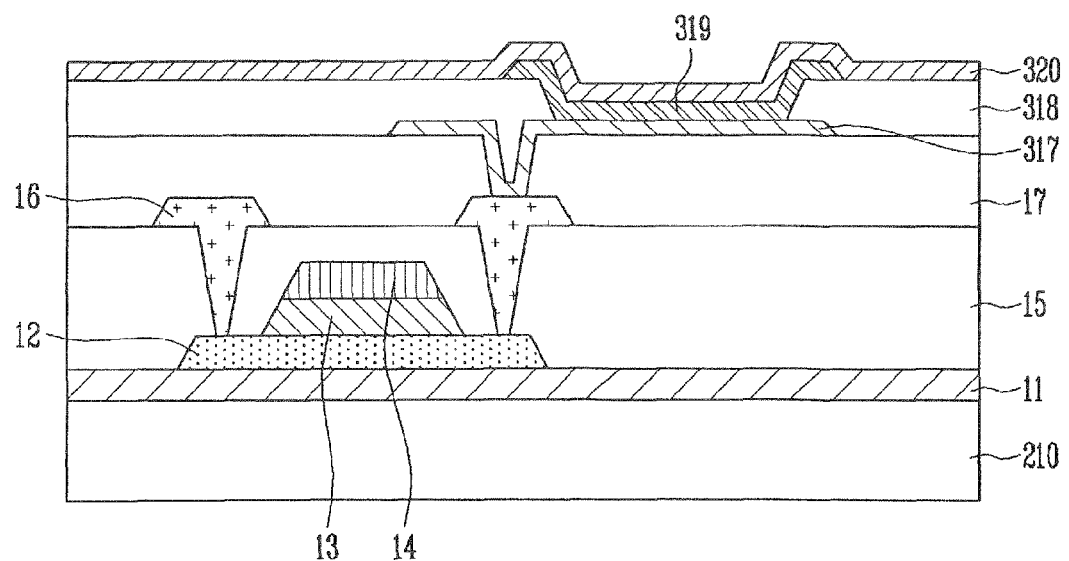
FIG. 5 is a cross-sectional view illustrating an organic light emitting diode of FIG. 4A.

Referring to FIG. 5, organic light emitting display device 300 includes anode electrode 317, cathode electrode 320, and organic thin film 319 formed between anode electrode 317 and cathode electrode 320. Organic thin film 319 is formed in a structure in which a hole-transport layer, an organic emission layer, and an electron transport layer are laminated, and may further include a hole injection layer and an electron injection layer. Moreover, organic light emitting display device 300 may further include a thin film transistor for controlling organic light emitting display device 300 and a capacitor for maintaining signals.

The thin film transistor has a structure as illustrated in FIG. 1, and can be manufactured by the manufacturing method according to the present invention as described with reference to FIGS. 2A to 2D.

Organic light emitting display device 300 including the thin film transistor will be described in detail with reference to FIGS. 4A to 5 as follows.

Buffer layer 11 is formed on substrate 210, and active layer 12 of an oxide semiconductor is formed on buffer layer 11. Gate insulating layer 13 and gate electrode 14 are formed on active layer 12. In this case, scan lines 224 connected to gate electrode 14 are formed in pixel region 220, and scan lines 224 extending from scan lines 224 of pixel region 220 the pad 228 for receiving signals from the outside may be formed in non-pixel region 230.

Insulating layer 15 is formed on the substrate including gate electrode 14, and the contact holes are formed in insulating layer 15 to expose the source and drain regions of active layer 12. The source and drain electrodes 16 are formed on insulating layer 15 to be connected to the source and drain regions of active layer 12 through the contact holes. In this case, source and drain electrodes 16 do not overlapped with gate electrode 14. Moreover, data lines 226 connected to source and drain electrodes 16 are formed in pixel region 220 during the formation of source and drain electrodes 16, and data lines 226 extending from data lines 226 of pixel region 220 and pad 228 for receiving signals from the outside are formed in non-pixel region 230.

Planarizing layer 17 is formed on the substrate including the source and drain electrodes 16, and via-holes are formed in planarizing layer 17 to expose source and drain electrode 16. Anode electrode 317 connected to source and drain electrode 16 through the via-holes is formed.

Pixel defining layer 318 is formed on planarizing layer 17 to expose a partial region (emission region) of anode electrode 317, organic thin film 319 is formed on exposed anode electrode 317, and cathode electrode 320 is formed on pixel defining layer 318 including organic thin film 319.

Referring to FIG. 4B, as described above, encapsulating substrate 400 sealing pixel region 220 is disposed above substrate 210 in which organic light emitting display device 300 is formed, and encapsulating substrate 400 is bonded to substrate 210 by sealing member 410, thereby completing display panel 200.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor, comprising:
   a substrate;
   an active layer comprised of zinc oxide (ZnO);
   a gate insulating layer formed of a dielectric on the active layer, the dielectric having an etching selectivity of 20 to 100:1 with respect to the zinc oxide active layer;
   a gate electrode formed on the gate insulating layer;
   an insulating layer formed on the substrate including the gate electrode and having contact holes to expose the active layer at both sides of the gate electrode; and
   source and drain electrodes connected to the active layer through the contact holes.

2. The thin film transistor as claimed in claim 1 wherein the zinc oxide active layer is doped with at least one ion of gallium (Ga), indium (In), tin (Sn), zirconium (Zr), hafnium (Hf), and vanadium (V).

3. The thin film transistor as claimed in claim 1, wherein the dielectric has a dielectric constant of 3 to 30.

4. The thin film transistor as claimed in claim 3, wherein the dielectric comprises at least one selected from a group consisting of aluminum oxide (AlxOy), hafnium oxide (HfxOy), yttrium oxide (YxOy), zirconium oxide (ZrxOy), and Gallium oxide (GaOx), where x and y are 1 to 3.

5. The thin film transistor as claimed in claim 1, wherein the source and drain electrodes do not overlap with the gate electrode.

6. The thin film transistor as claimed in claim 1, further comprising a buffer layer formed between the substrate and the active layer.

7. A method of manufacturing a thin film transistor, comprising:
   sequentially forming a zinc oxide layer, a dielectric layer, and a conductive layer on a substrate;
   forming a gate electrode by patterning the conductive layer
   forming a gate insulating layer by patterning the dielectric layer using the gate electrode as a mask, wherein the dielectric layer has an etching selectivity of 20 to 100:1 with respect to the zinc oxide layer;
   forming the active layer by patterning the zinc oxide layer;
   forming an insulating layer on the substrate including the gate electrode and forming contact holes to expose the active layer at both sides of the gate electrode; and
   forming source and drain electrodes connected to the active layer through the contact hole in the insulating layer.

8. The method as claimed in claim 7, wherein the zinc oxide active layer is doped with at least one ion selected from a group consisting of gallium (Ga), indium (In), tin (Sn), zirconium (Zr), hafnium (Hf), and vanadium (V).

9. The method as claimed in claim 7, wherein the dielectric layer comprises at least one material selected from a group consisting of aluminum oxide (AlxOy), hafnium oxide (HfxOy), yttrium oxide (YxOy), zirconium oxide (ZrxOy), and Gallium oxide (GaOx).

10. The method as claimed in claim 7, wherein the dielectric layer is patterned by dry etching process.

11. The method as claimed in claim 7, wherein the source and drain electrodes do not overlap with the gate electrode.

12. A flat panel display device, comprising:
   a first substrate in which a plurality of pixels are defined by a plurality of first conductive lines and second conductive lines, a thin film transistor controlling signals to be supplied to the respective pixels, and a first electrode connected to the thin film transistor is formed;
   a second substrate in which a second electrode is formed; and
   a liquid crystal layer injected into a sealed space between the first electrode and the second electrode;
   wherein the thin film transistor comprises:
      an active layer that includes zinc oxide and being arranged on the first substrate with:
         a gate insulating layer formed of a dielectric on the active layer, the dielectric having an etching selectivity of 20 to 100:1 with respect to the active layer;
         a gate electrode formed on the gate insulating layer;
         an insulating layer formed on the substrate including the gate electrode and having contact holes to expose the active layer at both sides of the gate electrode; and source and drain electrodes connected to the active layer through the contact holes.

13. The flat panel display device as claimed in claim 12 wherein the active layer is doped with at least one ion of gallium (Ga), indium (In), tin (Sn), zirconium (Zr), hafnium (Hf), and vanadium (V).

14. The flat panel display device as claimed in claim 12, wherein the dielectric has a dielectric constant of 3 to 30.

15. The flat panel display device as claimed in claim 12 wherein the dielectric comprises at least one material selected from a group consisting of yttrium oxide (YxOy), zirconium oxide (ZrxOy), and Gallium oxide (GaOx).

16. The flat panel display device as claimed in claim 12, wherein the source and drain electrodes do not overlap with the gate electrode.

17. A flat panel display device, comprising:
   an organic light emitting diode including a first substrate in which a first electrode, an organic thin film, and a second electrode and a thin film transistor controlling the organic light emitting diode are formed; and
   a second substrate disposed to face the first substrate, wherein the thin film transistor comprises:
   a zinc oxide active layer arranged on the first substrate;
   a gate insulating layer formed of a dielectric on the active layer, the dielectric having an etching selectivity of 20 to 100:1 with respect to the active layer;
   a gate electrode formed on the gate insulating layer;
   an insulating layer formed on the substrate including the gate electrode and having contact holes to expose the active layer at both sides of the gate electrode; and
   source and drain electrodes connected to the active layer through the contact holes.

18. The flat panel display device as claimed in claim 17 wherein the active layer is doped with at least one ion selected from a group consisting of gallium (Ga), indium (In), tin (Sn), zirconium (Zr), hafnium (Hf), and vanadium (V).

19. The flat panel display device as claimed in claim 17, wherein the dielectric has a dielectric constant of 3 to 30.

20. The flat panel display device as claimed in claim 19, wherein the dielectric comprises at least one selected from a group consisting of aluminum oxide (AlxOy), hafnium oxide (HfxOy), yttrium oxide (YxOy), zirconium oxide (ZrxOy), and Gallium oxide (GaOx).

21. The flat panel display device as claimed in claim 17, wherein the source and drain electrodes do not overlap with the gate electrode.

22. The thin film transistor of claim 1, wherein the zinc oxide active layer is doped with at least one ion of gallium (Ga) and tin (Sn).

23. The thin film transistor of claim 1, wherein the dielectric comprises at least one material selected from a group consisting of yttrium oxide (YxOy), zirconium oxide (ZrxOy), and Gallium oxide (GaOx), where x and y are 1 to 3.

24. The flat panel display device of claim 12, wherein the zinc oxide active layer is doped with at least one ion of gallium (Ga) and tin (Sn).

25. The flat panel display device of claim 17, wherein the zinc oxide active layer is doped with at least one ion of gallium (Ga) and tin (Sn).

26. The flat panel display device of claim 17 wherein the dielectric comprises at least one material selected from a group consisting of yttrium oxide (YxOy), zirconium oxide (ZrxOy), and Gallium oxide (GaOx), where x and y are 1 to 3.

* * * * *